(12) United States Patent
Scearce et al.

(10) Patent No.: US 12,107,047 B2
(45) Date of Patent: Oct. 1, 2024

(54) APPARATUS AND METHOD FOR DIRECT POWER DELIVERY TO INTEGRATED CIRCUIT PACKAGE

(71) Applicant: CISCO TECHNOLOGY, INC., San Jose, CA (US)

(72) Inventors: Stephen Aubrey Scearce, Apex, NC (US); Louis Smidt, Gibsonia, PA (US); Kadin Stephens, Rosamond, CA (US); Victor Liu, San Ramon, CA (US); Joel Richard Goergen, Soulsbyville, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 795 days.

(21) Appl. No.: 17/145,871

(22) Filed: Jan. 11, 2021

(65) Prior Publication Data

US 2022/0223522 A1   Jul. 14, 2022

(51) Int. Cl.
*H01L 23/528* (2006.01)
*H01L 23/367* (2006.01)
*H01L 23/50* (2006.01)
*H01L 23/538* (2006.01)

(52) U.S. Cl.
CPC ........ *H01L 23/5286* (2013.01); *H01L 23/367* (2013.01); *H01L 23/50* (2013.01); *H01L 23/5386* (2013.01)

(58) Field of Classification Search
CPC ... H01L 23/5286; H01L 23/367; H01L 23/50; H01L 23/5386
See application file for complete search history.

(56) References Cited

U.S. PATENT DOCUMENTS

| | | | | |
|---|---|---|---|---|
| 5,073,848 A | * | 12/1991 | Steigerwald | H02H 7/125 307/29 |
| 5,892,275 A | * | 4/1999 | McMahon | H01L 24/72 257/E23.079 |
| 6,757,175 B1 | | 6/2004 | Bartley | |
| 7,358,446 B2 | * | 4/2008 | Chheda | G06F 1/189 361/792 |
| 8,395,900 B2 | * | 3/2013 | Schrempp | G06F 1/189 361/810 |
| 10,504,848 B1 | * | 12/2019 | Parto | H02M 3/1584 |
| 10,735,105 B2 | | 8/2020 | Goergen | |
| 2005/0133901 A1 | * | 6/2005 | Edwards | H01L 23/49816 257/E23.079 |
| 2005/0219825 A1 | | 10/2005 | Campini | |
| 2013/0181360 A1 | * | 7/2013 | Kim | H05K 3/3436 257/777 |
| 2018/0012879 A1 | | 1/2018 | Mantiply | |

(Continued)

*Primary Examiner* — Peniel M Gumedzoe

(57) ABSTRACT

In one embodiment, an apparatus includes a connecting member configured for positioning on an upper surface of an integrated circuit package and a cable comprising a first end attached to the connecting member and a second end configured for electrically coupling with a power supply component. The connecting member is operable to position the cable for connection to the upper surface of the integrated circuit package to deliver power from the power supply component to the integrated circuit package with the power supply component and the integrated circuit package mounted on an upper surface of a printed circuit board. A method is also disclosed herein.

19 Claims, 7 Drawing Sheets

(56) References Cited

U.S. PATENT DOCUMENTS

2020/0183868 A1\* 6/2020 Hunkins ............. G06F 13/4068
2020/0196448 A1 6/2020 Punjabi
2020/0295955 A1 9/2020 O'Brien
2020/0337177 A1 10/2020 Krivonak \* cited by examiner

APPARATUS AND METHOD FOR DIRECT POWER DELIVERY TO INTEGRATED CIRCUIT PACKAGE

TECHNICAL FIELD

The present disclosure relates generally to power distribution, and more particularly, to direct power delivery to an integrated circuit package.

BACKGROUND

As ASIC (Application-Specific Integrated Circuit) process nodes advance and device power continues to increase, delivering requisite power is becoming more challenging. In conventional systems, power is typically transferred from a Point-of-Load (POL) to the ASIC through vias and planes internal to a printed circuit board, which has a number of drawbacks.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1:
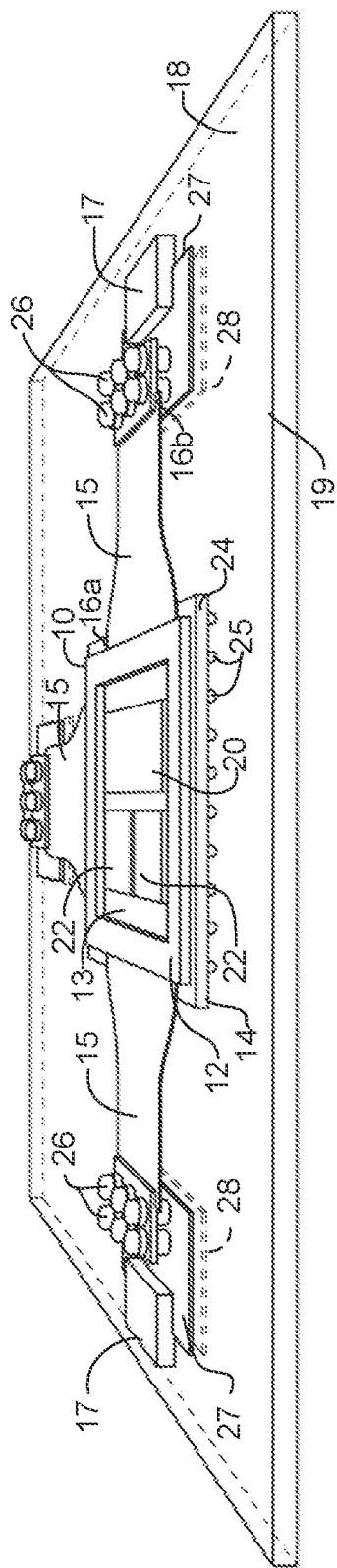
FIG. 1 is a perspective of a power delivery device electrically coupling power supply components on a printed circuit board to an integrated circuit package, in accordance with one embodiment.

In one embodiment, an apparatus generally comprises a connecting member configured for positioning on an upper surface of an integrated circuit package and a cable comprising a first end attached to the connecting member and a second end configured for electrically coupling with a power supply component. The connecting member is operable to position the cable for connection to the upper surface of the integrated circuit package to deliver power from the power supply component to the integrated circuit package with the power supply component and the integrated circuit package mounted on an upper surface of a printed circuit board.

In another embodiment, an apparatus generally comprises a printed circuit board, a plurality of power supply components mounted on a surface of the printed circuit board, an integrated circuit package mounted on the surface of the printed circuit board, a connecting member positioned on an upper surface of the integrated circuit package, and a plurality of cables coupled to the connecting member and operable to deliver power from the power supply components to the integrated circuit package.

In yet another embodiment, a method generally comprises positioning a connecting member on an upper surface of an integrated circuit package mounted on a printed circuit board, the connecting member attached to a cable, electrically coupling the cable to a POL (Point-of-Load) module, and delivering power from the POL module to the integrated circuit package through the cable.

Further understanding of the features and advantages of the embodiments described herein may be realized by reference to the remaining portions of the specification and the attached drawings.

EXAMPLE EMBODIMENTS

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown but are to be accorded the widest scope consistent with the principles and features described herein. For purpose of clarity, details relating to technical material that is known in the technical fields related to the embodiments have not been described in detail.

In a conventional Point-of-Load (POL) to ASIC (Application-Specific Integrated Circuit) connection, power is transferred through vias and planes internal to a PCB (Printed Circuit Board) and ASIC package. This results in a number of drawbacks, including for example, efficiency loss due to IR drop of the PCB, vias, and ASIC package, and introduction of resistance and parasitic inductance. Also, there is limited space available for current carrying traces and vias, and PCB congestion often occurs due to a trade-off between heavy copper areas and large high-speed signals that need to break out of a BGA (Ball Grid Array) area. Thus, routing through the PCB sacrifices valuable space and may result in higher layer counts and expensive non-symmetric stack-ups to handle the higher current. Moreover, the current carrying traces that are thermally coupled to the PCB and ASIC substrate and die may result in excess heat and expose components near high current carrying planes to excessive thermal stress. Heat from internal planes also adds to the already high thermal energy of the ASIC as the heat couples to components on a top layer through the PCB to the package substrate.

The embodiments described herein provide power delivery from a power supply component (e.g., POL module) to an integrated circuit (e.g., ASIC) by bypassing power planes and vias in a PCB and internal to the ASIC package. As described in detail below, one or more cables (e.g., flexible bus bars) are attached to the ASIC package with a removable connecting member (e.g., stiffener ring) in order to carry power closer to the die. One or more embodiments provide simplified rework options, operates with existing cooling solutions, and enables a reduction in PCB layer count, while providing improved decoupling and space savings on surface layers of the PCB. For example, the embodiments may provide simplified disassembly, reworking, and reassembly of the ASIC package without desoldering an underside BGA of the integrated circuit package. One or more embodiments may be implemented, for example, for power delivery to a high-power ASIC (or other integrated circuit) with current requirements over 200 amps to provide a 3:1 improvement ratio in terms of loss due to power delivery from the POL to the ASIC die, as compared to conventional power delivery through the PCB, The embodiments described herein may operate in the context of a data communications network including multiple network devices. The network may include any number of network devices in communication via any number of nodes (e.g., routers, switches, gateways, controllers, edge devices, access devices, aggregation devices, core nodes, intermediate nodes, power sourcing equipment, powered devices, or other network devices), which facilitate passage of data within the network. One or more of the network devices may comprise one or more power delivery devices described herein. The network device may further include any combination of memory, processors, power supply units, and network interfaces.

Figure 2:
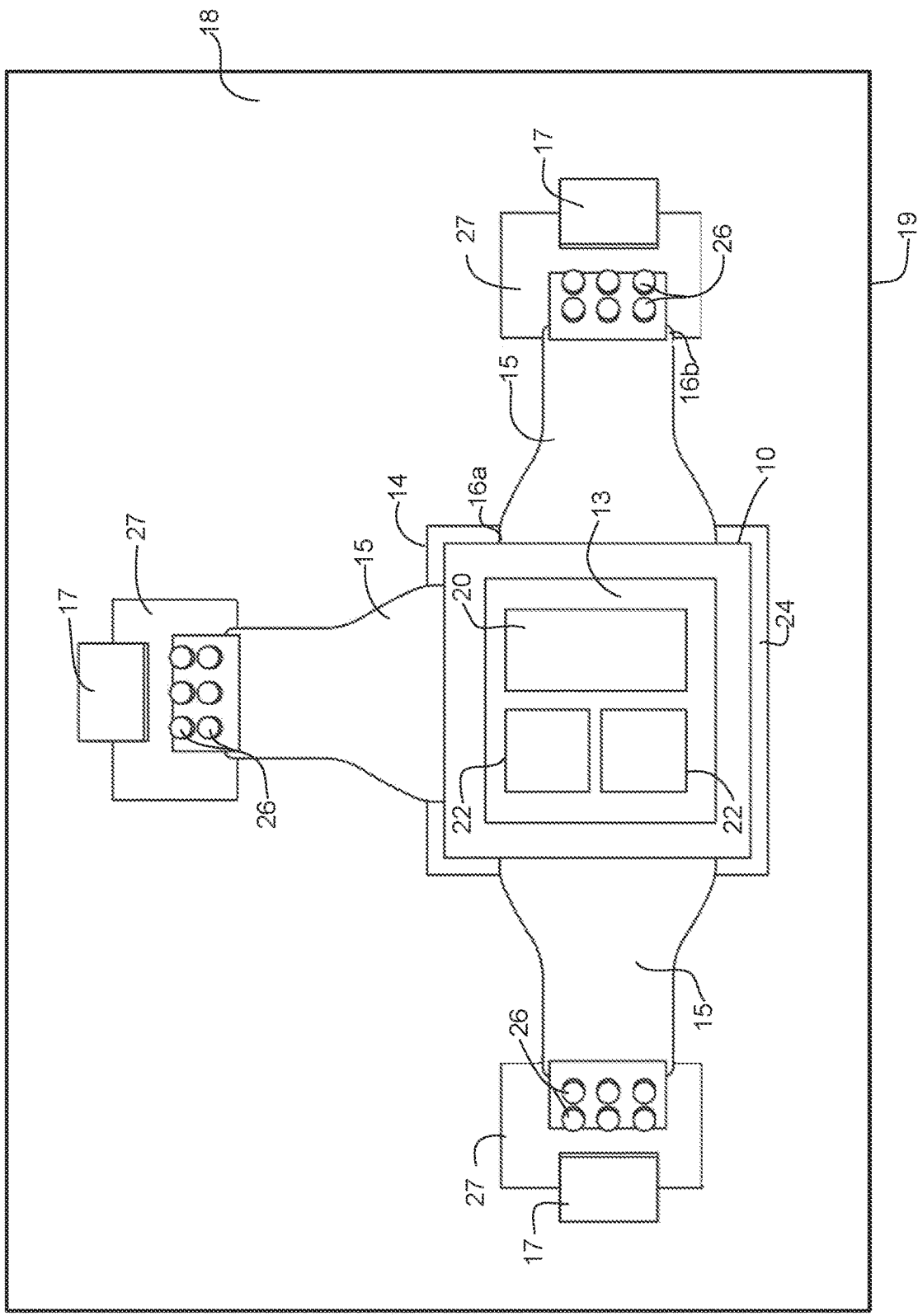
FIG. 2 is a top view of the power delivery device, power supply components, and integrated circuit package of FIG. 1.

Referring now to the drawings, and first to FIGS. 1 and 2, a power delivery device is shown for delivering power from power supply components to an integrated circuit package, in accordance with one embodiment. In one embodiment, an apparatus 10 comprises a connecting member 12 configured for positioning on an upper surface 13 of an integrated circuit package 14 and a cable 15 comprising a first end 16a attached to the connecting member and a second end 16b configured for electrically coupling with a power supply component 17. The connecting member 12 is operable to position the cable 15 on the upper surface 13 of the integrated circuit package 14 for delivering power from the power supply component 17 to the integrated circuit package with the power supply component and the integrated circuit package mounted on an upper surface 18 of a printed circuit board 19. The cable 15 provides a direct connection for power delivery from the power supply component 17 (e.g., POL module) to the integrated circuit package 14 (e.g., ASIC package), while bypassing at least a portion of a power plane and vias in the PCB, thereby eliminating traces and vias used in conventional systems to route power from the POL module to the integrated circuit package and freeing up valuable space in the PCB that may be used for routing high-speed signals, for example.

In one embodiment, an apparatus comprises the printed circuit board 19, a plurality of power supply components 17 mounted on the surface 18 of the printed circuit board, the integrated circuit package 14 mounted on the surface of the printed circuit board, the connecting member 12 positioned on the upper surface 13 of the integrated circuit package 14, and a plurality of cables 15 attached to the connecting member and operable to deliver power from the power supply components to the integrated circuit package.

The connecting member 12 may comprise, for example, a rigid, generally flat and thin element such as a stiffener for positioning on the upper surface 13 of the integrated circuit package 14. In one or more embodiments, the connecting member comprises a frame (e.g., rectangular or circular ring with a central opening or semicontinuous structure (e.g., bar, U-shaped bar) which may be formed from metal, plastic, or any other suitable material. In the example shown in FIGS. 1 and 2, the connecting member 12 comprises a ring with the cables 15 attached to three sides thereof for delivering power from three power supply components 17 to the integrated circuit package 14. The connecting member 12 may be formed in any shape, size or thickness based on the number of connecting cables 15 and size or shape of the integrated circuit package 14. The central opening of the ring 12 is configured for receiving one or more die 20, 22 mounted on a substrate 24 of the integrated circuit package 14. For example, an ASIC 20 and one or more other die 22 (e.g., memory component) may be positioned within the central opening of the ring 12. Any number of cables 15 may be affixed to the ring 12 (e.g., one or more cables on one or more sides of the ring). Three cables 15 are shown in FIGS. 1 and 2, however, any number of cables may be attached to the ring 12 for delivering power from any number of power supply components 17. As described below, the connecting member 12 positions and secures the cable to a contact area on the upper surface 13 of the integrated circuit package 14.

The cable 15 may comprise, for example, a flexible bus bar, semi-rigid flex type PCB, or any other type of cable having any size, thickness, diameter, or cross-sectional shape (e.g., round, rectangular). As described below, the cable 15 may have any number of conductors in any arrangement (e.g., interleaved, stacked). The cable 15 may be ordered to size or bent to adapt to various routing configurations, thereby providing flexibility as to the positioning of the power supply components 17 on the printed circuit board 19. Bus bar dimensions may be increased to accommodate increased current, without any changes to the PCB. The cables 15 are preferably insulated for safety. For example, flex bus bar cables 15 may be insulated to provide safe handling with currents greater than 500 amps. The cable 15 is preferably configured to carry both power and return current and may be configured with additional electrical components (e.g., capacitors, power supply components, current sense resistors, and the like) integrated into the semi-rigid or flex cable design.

The first end 16a of the cable 15 may be connected to the upper surface 13 of the integrated circuit package 14 with a removable spring finger connection (e.g., conductive pads or pins) or any other suitable contacts or connector. The cable 15 is affixed underneath the connecting member 12, which is configured to position and secure cable contacts to a voided conductive contact power plane on the uppermost buildup layers (upper surface) of the integrated circuit package 14.

The second end 16b of the cable 15 is electrically coupled to the power supply component 17 through any suitable conductive element (e.g., substrate, trace, via, power plane, ground plane) on the surface of the PCB 19 or formed within the PCB. In the example shown in FIGS. 1 and 2, six screw terminals 26 extend through the cable 15 and into a substrate 27 of the power supply component 17. In one example, power is transmitted from a power module through the substrate 27 to the screw terminals 26. Screw tops 26 of the bus bar terminations may be covered with an insulator for safety. Any other low-loss removable power connector may also be used to electrically couple the cable to the power component. As described below with respect to FIG. 3, power may be transmitted within the power supply component or between a POL and the power connector through one or more planes 28 (e.g., power plane, ground plane) formed in one or more layers of the PCB.

Direct attachment of the cable 15 to the upper surface 13 of the integrated circuit package 14 provides a path from the power supply component 17 with lower resistance as compared to conventional routing of power from the POL to the ASIC through power planes in the PCB. Airflow over the cable 15 provides improved thermal performance and reduces thermal heating to PCB substrate and nearby components by eliminating power planes. Simplified rework of the ASIC is provided by removing the connecting member and cable assembly of the power delivery device 10 as a one piece removable assembly.

In one or more embodiments, the integrated circuit package 14 comprises a lidless package for direct thermal contact with a cooling element, as described below. The integrated circuit package 14 may comprise one or more components 20, 21 (e.g., ASIC, NPU (Network Processing Unit), memory (e.g., on-substrate memory, high-bandwidth memory), SerDes (Serializer/Deserializer), optical engine, photonic chip, or any other electronic component, optical component, chip, chiplet, die, and the like) mounted on the substrate 24 with or without a lid. As shown in FIG. 1, the integrated circuit package 14 may be mounted on the PCB 19 with a BGA 25 or other suitable connection.

The power supply component 17 may comprise a POL module that receives power from a power source (power supply or other power component) positioned on the printed circuit board or another circuit board. For example, the POL may receive power from a PSU (Power Supply Unit) through a backplane and power may be transmitted to the POL through one or more planes within the PCB and transferred through one or more vias to the POL module.

It is to be understood that the term "power supply component" as used herein may refer to any type of power supply, power converter, power regulator, or other power supply component, including for example, discrete POLs and modules or power delivery block-based voltage regulator designs. Also, it may be noted that the POLs may be single phase or multi-phase POLs that may work together to deliver one or more output. As described below with respect to FIG. 6, the term "POL module" as used herein may also refer to one component or portion of a POL (e.g., regulated POL), with a fixed POL located separately from the regulated POL and providing power through a power plane in the PCB, for example.

Also, it should be noted that the terms lower, upper, bottom, top, below, above, and the like, which may be used herein are relative terms dependent upon the orientation of the package and components and should not be interpreted in a limiting manner. These terms describe points of reference and do not limit the embodiments to any particular orientation or configuration.

Figure 3:
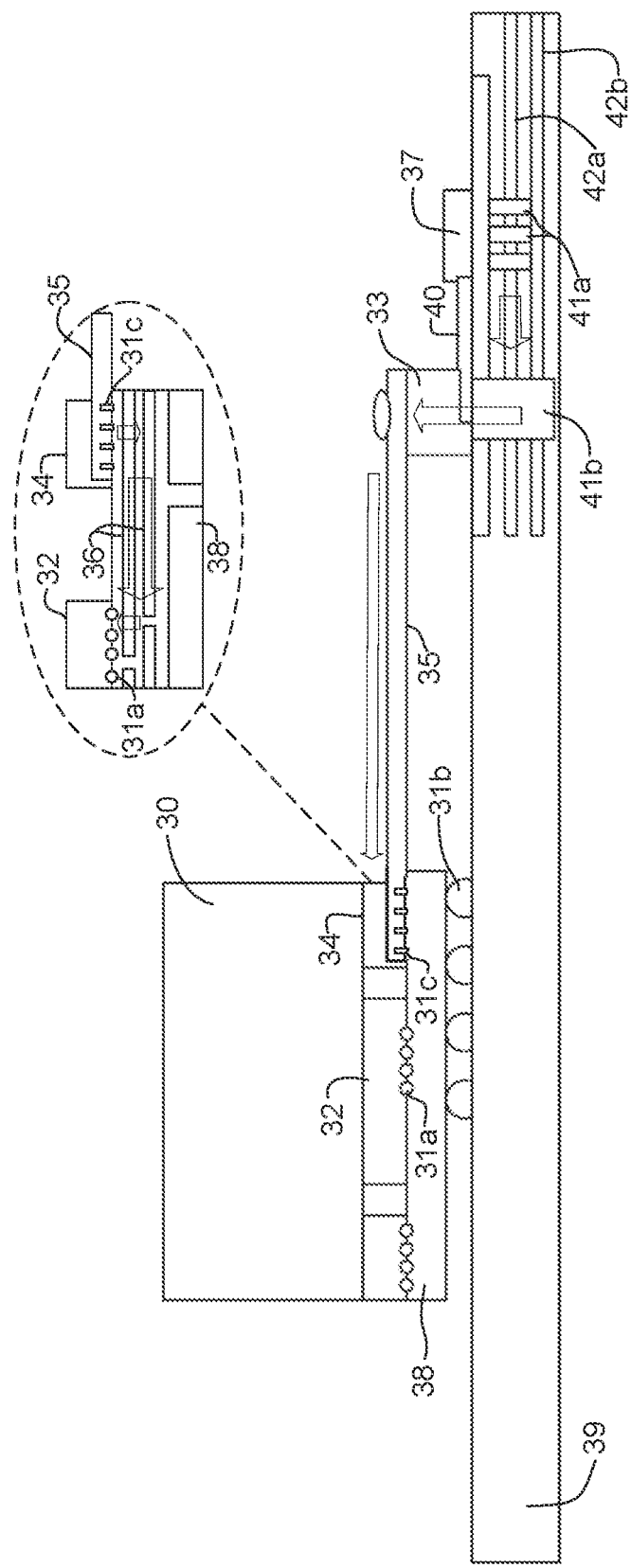
FIG. 3 is a cross-sectional schematic illustrating delivery of power from the power supply component to the integrated circuit package by the power delivery device, in accordance with one embodiment.

FIG. 3 is a cross-sectional schematic illustrating a power delivery path through the power delivery device, in accordance with one embodiment. An integrated circuit package comprising a die 32 and substrate 38 is mounted on a PCB 39. For simplification, only one cable 35 is shown in FIG. 3. The die 32 may be coupled to the substrate 38 and the integrated circuit package coupled to the PCB 39 through a solder ball connection (e.g., BGA) 31a, 31b, respectively. A connecting member 34 and attached cable 35 of the power delivery device are positioned on an upper surface of the substrate 38 and coupled via a removable connector (e.g., spring fingers) 31c.

As previously described, the cable 35 transmits power directly from a POL module 37 to the integrated circuit package. The cable 35 is electrically coupled to the power supply component with a power connector 33 (e.g., screw terminal). In the example shown in FIG. 3, the PCB 39 comprises a power plane 42a and ground plane 42b electrically coupling the POL 37 to the connector 33 through vias 41a and 41b.

Arrows in FIG. 3 illustrate a power delivery path from the power supply component (e.g., POL 37, substrate 40, and associated vias 41a, 41b, and power plane 42a) through the power delivery device (power connector 33, cable 35, spring fingers 31c) to the integrated circuit package. In the example shown in FIG. 3, the POL 37 transmits power through via 41a and power plane 42a to via 41b electrically coupled to power connector (e.g., screw terminal) 33. The power connector 33 may also be electrically coupled to the POL 37 through a ground plane 42b, for example. In another example, power may be transmitted through a surface plane (substrate) 40 on a surface of the PCB 39.

Details of power delivery from the cable 35 to the ASIC 32 are shown in a cutout view in FIG. 3. Power transmitted through the cable 35 passes through connector 31c to the substrate 38 of the integrated circuit package. Power passes through one or more power planes 36 and vias to the die 32. By transmitting power to the upper surface of the substrate 38, rather than to a lower surface at the PCB interface, current flowing through the integrated circuit package core and micro-vias is reduced, thereby prolonging the lifespan of the integrated circuit package.

It is to be understood that the electrical path shown in FIG. 3 is only an example and other power connections through different arrangements of power planes, ground planes, vias, surface planes, substrates, or connectors may be used for power transfer between the power delivery device and POL or power delivery device and ASIC, without departing from the scope of the embodiments. As can be observed from FIG. 3, routing of power through the power delivery device opens up all of the PCB space below the cable 35 for other uses (e.g., transmittal of high-speed signals).

In the example shown in FIG. 3, a cooling element 30 (e.g., heat sink, vapor chamber, or cold plate (liquid, gas, or multi-phase based cooling)) is thermally coupled to the lidless die 32 and clamps the connecting member 34 and attached cable 35 to the integrated circuit package. The cooling element 30 is attached to the printed circuit board 39 with fasteners (e.g., spring loaded screws) (not shown in FIG. 3). Attachment of the cooling element 30 to the PCB 39 provides sufficient downward force to clamp the cable 35 to the upper surface of the integrated circuit package. The cables are positioned so as not to interfere with the connection points between the cooling element 30 and the printed circuit board 39. The power delivery device may easily be removed by first removing the cooling element 30 and then unplugging the cable connectors 31 from the upper surface of the integrated circuit package and removing the connecting member and attached cable.

Figure 4:
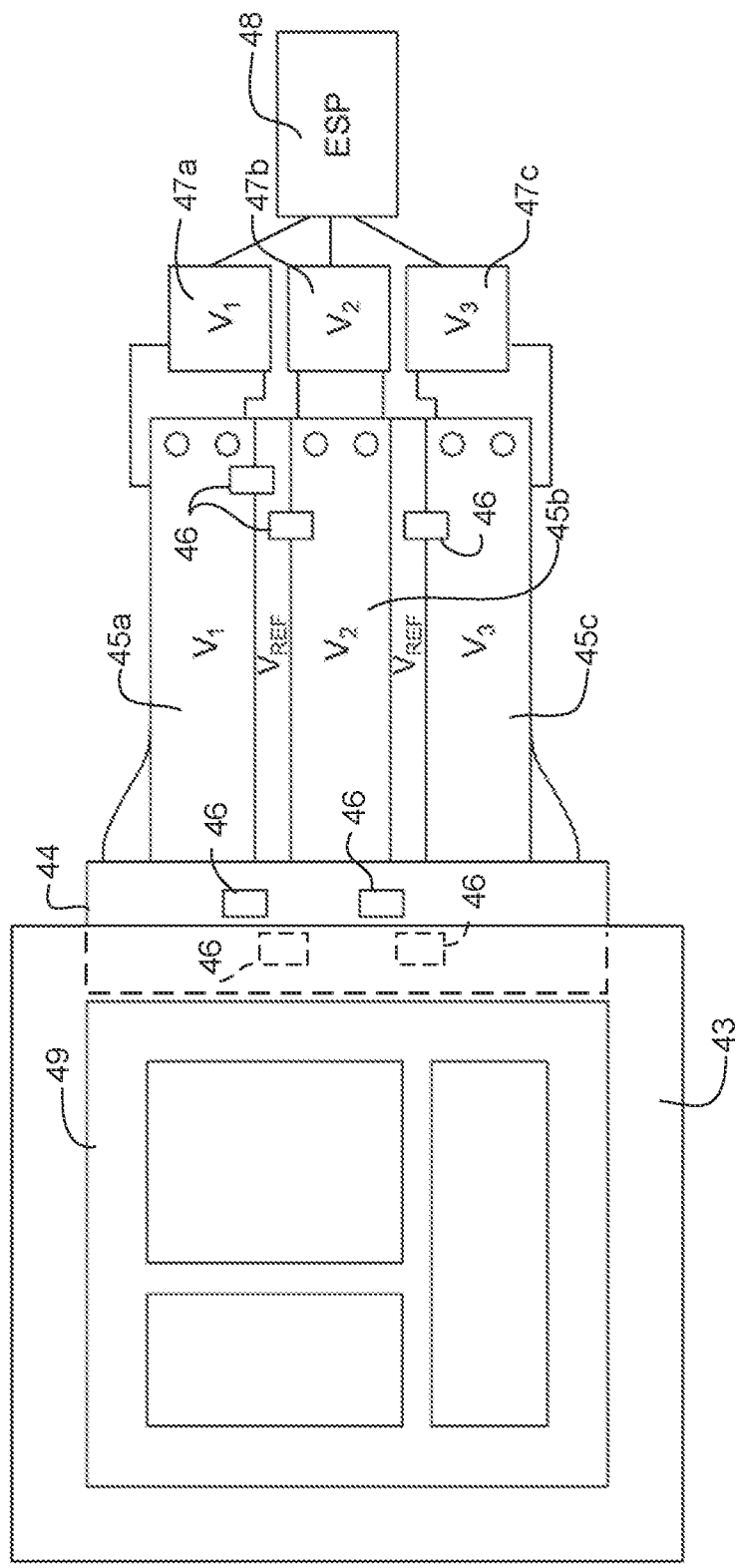
FIG. 4 is a top view of a multi-phase power supply coupled to the integrated circuit package with a power delivery device, in accordance with one embodiment.

FIG. 4 is a top view of a connecting member 43 and affixed semi-rigid flex cable coupled to an integrated circuit package 49, in accordance with one embodiment. The connecting member comprises a stiffener ring 43 and the cable comprises the semi-rigid flex cable comprising a plurality of conductors 45a, 45b, 45c and integrated rigid PCB section 44 positioned adjacent to the ring 43. In the example shown in FIG. 4, the ring 43 clamps the rigid portion 44 to the integrated circuit package 49. In another example, the ring 43 may be replaced with the member 44 of the cable, which acts as the connecting member.

Multi-phase pulse power (Extended Safe Power (ESP)) is delivered to power components 47a ($V_1$), 47b ($V_2$), and 47c ($V_3$). Conductors 45a, 45b, 45c of the cable carry the three phases $V_1$, $V_2$, $V_3$, along with reference voltage $V_{REF}$. It is to be understood that the cable arrangement shown in FIG. 4 is only an example and the cable may be configured for single-phase or multi-phase power delivery in an interleaved arrangement or another configuration.

As previously noted, the cable assembly may include one or more electrical components 46. For example, the semi-rigid PCB type cable may be designed to include space to mount the electrical components 46 including, for example, decoupling capacitors, power supply components, current sense resistors, or any combination thereof, directly on the rigid section of the PCB 44 or flex cable, thereby minimizing board real estate and migrating these components closer to the load (e.g., ASIC die on integrated circuit package 49). The very close proximity of decoupling components to the die makes the high frequency decoupling provided by these components very effective. In the example shown in FIG. 4, seven decoupling capacitors 46*a* are positioned at various locations along the cable assembly.

Figure 5:
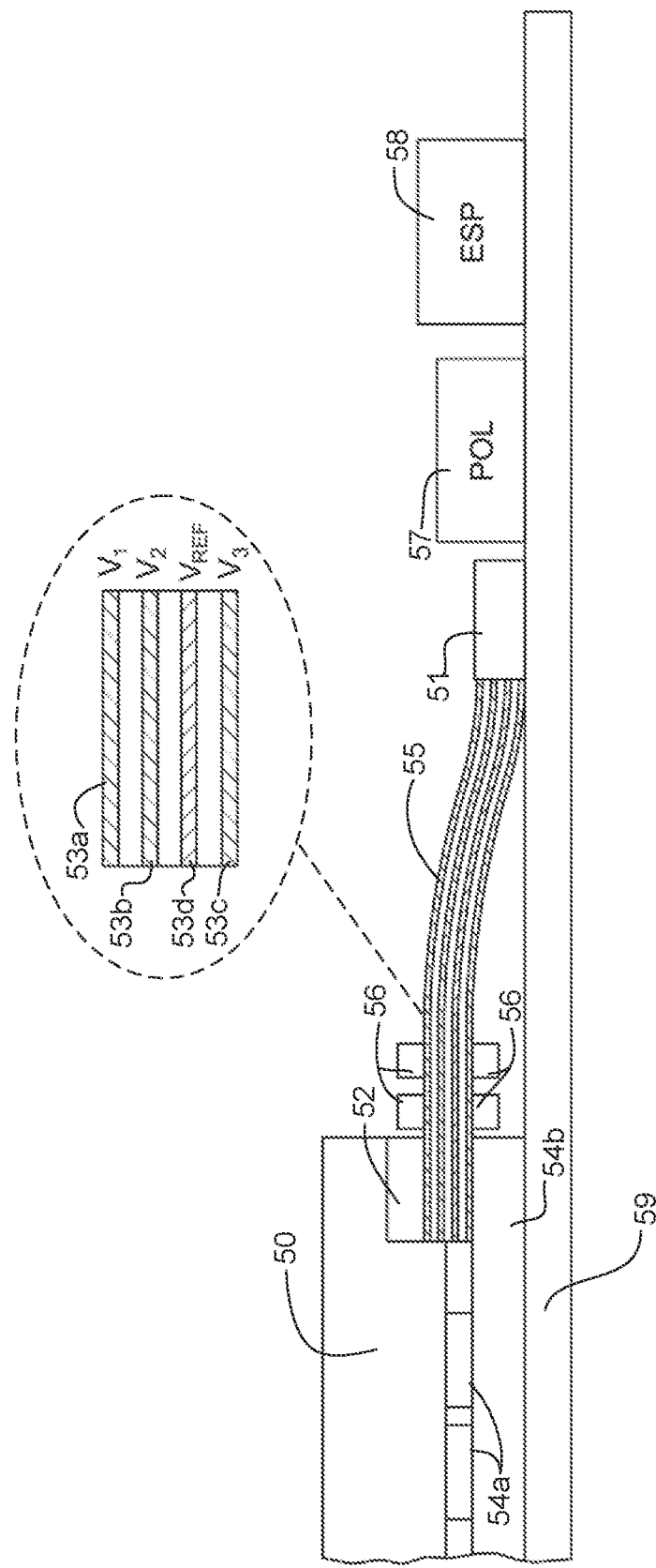
FIG. 5 is a side view of the multi-phase power supply coupled to the integrated circuit package with a power delivery device comprising stacked conductors, in accordance with one embodiment.

FIG. 5 is a side view illustrating another example of a flexible cable 55 with stacked conductors (flex PCB stackup), in accordance with one embodiment. A cooling element 50 is positioned over connecting member 52 affixed to the cable 55. The cooling element 50 is thermally coupled to die 54*a* mounted on substrate 54*b* of the integrated circuit package. Power is provided to a POL module 57 mounted on PCB 59 by an ESP power source 58. As shown in FIG. 5, a first end of the cable 55 is electrically coupled to an upper side of the substrate 54*b* of the integrated circuit package and a second end of the cable is electrically coupled to the POL module 57 at power connector 51. In this example, the cable 55 carries three phases $V_1$, $V_2$, and $V_3$ on conductors 53*a*, 53*b*, 53*c* and reference voltage at 53*d* (as shown at cutout view in FIG. 5). Decoupling capacitors (or other electrical components) 56 are attached to an upper and lower side of the cable near the first end of the cable.

Figure 6:
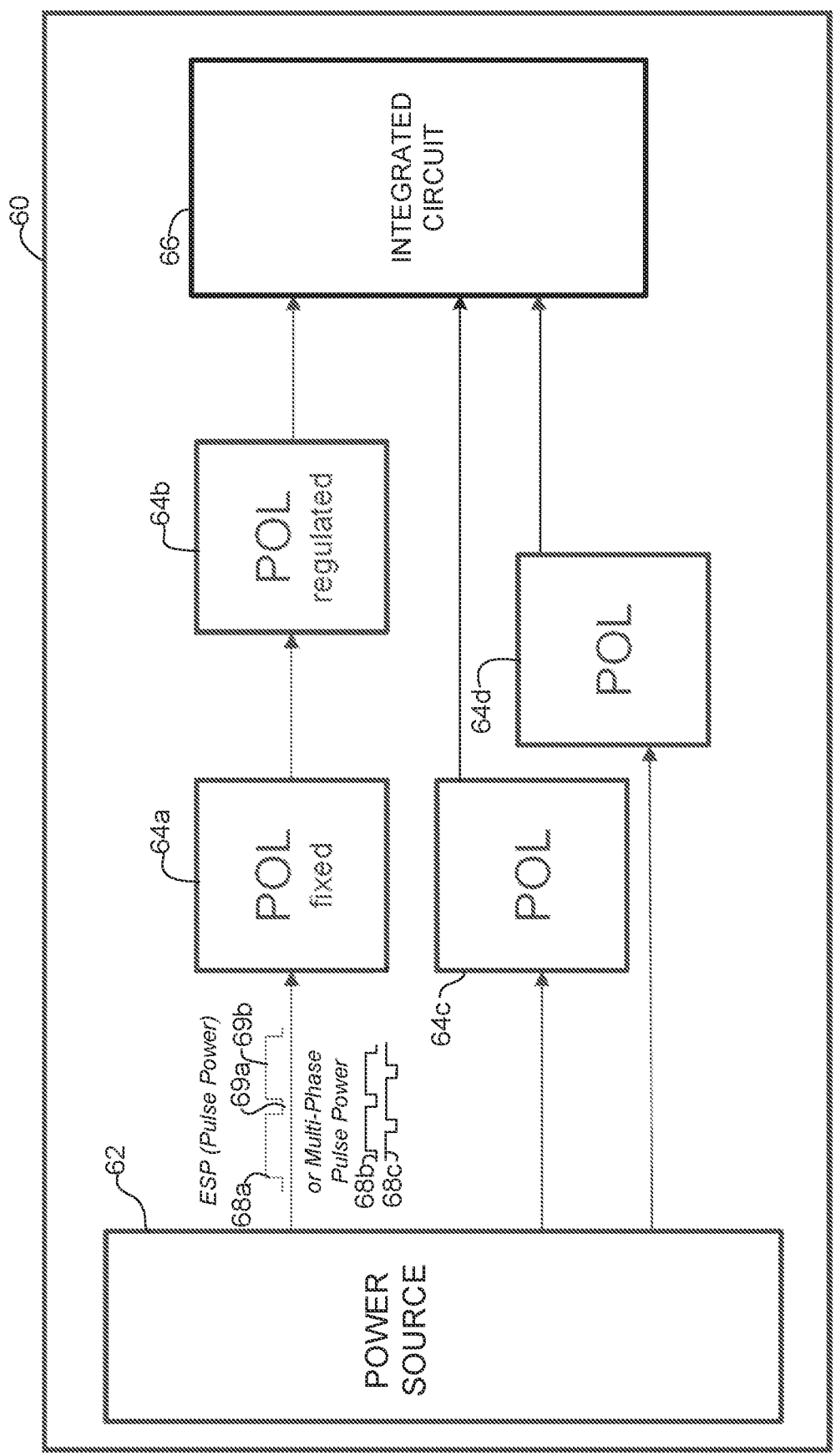
FIG. 6 is a block diagram illustrating an example of power distribution through POL (Point-of-Load) modules, in accordance with one embodiment.

As previously noted, a power supply component coupled to the cable may comprise a POL module, or a portion of a POL (e.g., regulated POL). FIG. 6 is a block diagram illustrating an example of power distribution through a POL power supply located on a board 60. Power is delivered at power source 62 to a plurality of POLs (POL modules (circuits), power supplies) 64*a*, 64*b*, 64*c*, 64*d*. In one example, pulse power at a voltage greater than 100V (e.g., 108V, 380V) or any other suitable voltage, is delivered to the POL (or a fixed POL component). In another example, the power source 62 delivers 54 VDC (or any other suitable voltage (e.g., intermediate bus voltage level selected based on overall system efficiency, routeability, and cost)) to one or more POL modules. The fixed POL 64*a* transfers power (e.g., at 54 VDC or other voltage) to the regulated POL (POL converter, POL regulator) 64*b*, which distributes power to integrated circuit 66 (e.g., ASIC or other die, chip, multichip module, and the like). The fixed POL 64*a* may be connected to the regulated POL 64*b* through a bus bar interconnect or any other suitable electrical connection. The regulated POL 64*b* may provide, for example 150 amp or greater output.

As described above with respect to FIGS. 4 and 5, ESP may be supplied to one or more of the POL modules. The term "ESP" or "pulse power" (also referred to as "pulsed power") as used herein refers to power that is delivered in a plurality of voltage pulses (sequence of voltage pulses) 68*a* in which voltage varies between a very small voltage (e.g., close to 0V, 3V) during a pulse-off time 69*a* and a larger voltage (e.g., ≥12V) during a pulse-on time 69*b*. High voltage pulse power (high voltage pulses) (e.g., >56V, ≥60V, ≥300V) may be transmitted from power sourcing equipment (PSE) to a powered device (PD) for use in powering the powered device, whereas low voltage pulse power (low voltage pulses) (e.g., ~12V, ~24V, ≤30V, ≤56V) may be used over a short interval for start-up (e.g., initialization, synchronization, charging local energy storage, powering up a controller, testing, or any combination thereof). The pulse power may also be delivered in multiple phases, with the pulses offset from one another between phases to provide continuous power, as shown in the simplified voltage traces 68*b*, 68*c* of FIG. 6.

It is to be understood that the voltage, power, and current levels described herein are only provided as examples and power may be delivered at different levels (volts, amps, watts) than described herein without departing from the scope of the embodiments.

Figure 7:
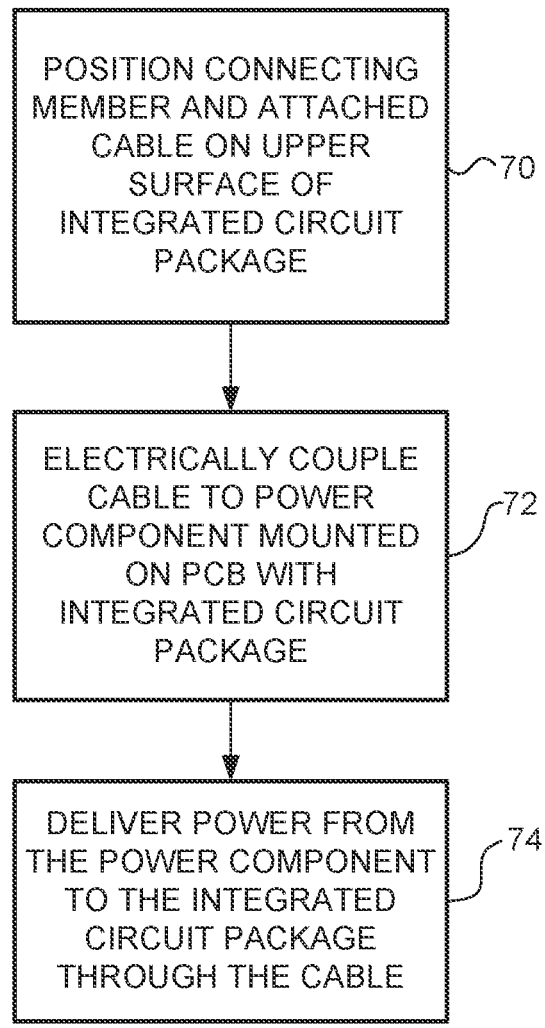
FIG. 7 is a flowchart illustrating an overview of a process for power delivery from the power supply component to the integrated circuit package with the power delivery device, in accordance with one embodiment.

FIG. 7 is a flowchart illustrating an overview of a process for implementing the power deliver device described herein, in accordance with one embodiment. The connecting member 12 and attached cable 15 are mounted on the integrated circuit package 14 and the cable is coupled to the upper surface 13 of the integrated circuit package (step 70) (FIGS. 1 and 7). This may include, for example, positioning the connecting member over the integrated circuit package and attaching the connector (e.g., spring fingers 31*c*) to the upper surface of the substrate 38 (FIG. 3). The cable 15 is electrically coupled to the power supply component 17 mounted on the PCB 19 with the integrated circuit package 14 (step 72) (FIGS. 1 and 7). For example, a power connector (e.g., screw terminals 26) may be connected to the power supply component 17 through a power plane within or on the PCB. Power is delivered from the power supply component 17 directly to the integrated circuit package 14 through the cable 15 (step 74). The cable 15 allows power to be delivered to the upper side 13 of the integrated circuit package 14, thereby bypassing power planes and vias in the PCB and integrated circuit package.

It is to be understood that the process shown in FIG. 7 and described above is only an example and steps may be added, modified, combined, or reordered without departing from the scope of the embodiments.

As can be observed from the foregoing, one or more embodiments described herein provide advantages over conventional power delivery systems. For example, one or more embodiments provide a reduced resistance POL to ASIC connection and an improvement in path resistance and path loss efficiency over conventional connection methods. The embodiments allow for higher amounts of power to be carried into an ASIC by reducing the power losses and parasitics encountered in a conventional power delivery system. By rerouting the current from PCB power planes, vias under the ASIC, ASIC attach, and most of the z-axis ASIC substrate, thermal coupling from the PCB power planes is reduced. One or more embodiments provide dedicated off-board space for decoupling capacitors or other electrical components, thereby further reducing board usage. One or more embodiments provide a reduction in the current flow through the integrated circuit package core and microvias, thereby increasing lifespan of the ASIC and reducing design time previously needed for high power routing within the ASIC package and on the PCB. As described above, simplified rework options are also provided with the embodiments described herein.

Although the apparatus and method have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. An apparatus comprising:
   a first cable;

a connecting member configured for positioning on an upper surface of an integrated circuit package, wherein the connecting member is attached to a first end of the first cable, and the connecting member is configured to position the first cable for connection to the upper surface of the integrated circuit package to deliver power from a power supply component to the integrated circuit package;

a second cable attached to the connecting member for delivering power from an additional power supply component to the integrated circuit package; and a terminal for electrically coupling a second end of the first cable to the power supply component.

2. The apparatus of claim 1 wherein the connecting member comprises a ring coupled to a plurality of cables comprising the first cable and the second cable for delivering power from a plurality of power supply components comprising the power supply component and the additional power supply component to the integrated circuit package.

3. The apparatus of claim 1 wherein the first cable comprises a flexible bus bar.

4. The apparatus of claim 1 wherein the first cable comprises a semi-rigid flexible cable and the connecting member comprises a rigid member.

5. The apparatus of claim 1 further comprising spring fingers for connecting the first cable to said upper surface of the integrated circuit package.

6. The apparatus of claim 1 wherein the first cable is configured to carry return current, to deliver multi-phase pulse power, or both.

7. The apparatus of claim 1 wherein the terminal comprises a screw terminal.

8. The apparatus of claim 1 further comprising the power supply component, wherein the power supply component comprises a POL (Point-of-Load) module.

9. The apparatus of claim 1 further comprising an electrical component positioned on the first cable.

10. The apparatus of claim 1 further comprising a printed circuit board, wherein the power supply component and the integrated circuit package are mounted on an upper surface of the printed circuit board.

11. An apparatus comprising:
a printed circuit board;
a plurality of power supply components mounted on a surface of the printed circuit board;
an integrated circuit package having a substrate mounted on said surface of the printed circuit board and a die positioned on an upper surface of the substrate;
a connecting member positioned on the upper surface of the substrate, wherein the connecting member comprises a ring that defines an opening within which the substrate is positioned; and
a plurality of cables operable to deliver power from said plurality of power supply components to the substrate and to the die, wherein each cable of the plurality of cables is clamped between the upper surface of the substrate and the connecting member.

12. The apparatus of claim 11 wherein the connecting member is positioned along a periphery of said upper surface of the substrate of the integrated circuit package.

13. The apparatus of claim 11 further comprising a cooling element positioned on top of the integrated circuit package with the connecting member interposed between the cooling element and the integrated circuit package.

14. The apparatus of claim 11 further comprising an electrical component positioned on at least one of the plurality of cables.

15. The apparatus of claim 11 further comprising spring fingers for connecting the plurality of cables to said upper surface of the substrate of the integrated circuit package and screw terminals for electrically coupling the plurality of cables to the plurality of power supply components.

16. The apparatus of claim 11 wherein the plurality of cables is configured for delivering multi-phase pulse power and carrying return current.

17. A method comprising:
placing a cable in contact with an upper surface of a substrate of an integrated circuit package mounted on a printed circuit board;
positioning a connecting member on the upper surface of the substrate of the integrated circuit package to clamp the cable between the upper surface of the substrate and the connecting member;
electrically coupling the cable to a POL (Point-of-Load) module;
delivering power from the POL module to the substrate through the cable; and
delivering the power from the substrate to a die of the integrated circuit package.

18. The method of claim 17 wherein the POL module comprises a regulated POL module and wherein the method further comprises delivering the power through a capacitor coupled to the cable.

19. The method of claim 17 further comprising positioning a cooling element on top of the integrated circuit package with the connecting member interposed between the cooling element and the integrated circuit package.

* * * * *